United States Patent [19]

Hung et al.

[11] Patent Number: 4,717,740
[45] Date of Patent: Jan. 5, 1988

[54] AQUEOUS ALKALINE DEVELOPABLE, UV CURABLE URETHANE ACRYLATE COMPOUNDS AND COMPOSITIONS USEFUL FOR FORMING SOLDER MASK COATINGS

[75] Inventors: Paul L. K. Hung, Edison; Kenneth K. S. Tseng, Piscataway, both of N.J.

[73] Assignee: M&T Chemicals Inc., Woodbridge, N.J.

[21] Appl. No.: 735,411

[22] Filed: May 17, 1985

[51] Int. Cl.⁴ .......................... C08F 2/50; C08F 26/02
[52] U.S. Cl. ...................................... 522/96; 430/284; 522/97; 525/920; 526/301; 528/75; 560/84; 560/88; 560/90; 560/115; 560/158
[58] Field of Search ................... 430/284; 522/96, 97; 560/84, 88, 90, 115

[56] References Cited

U.S. PATENT DOCUMENTS

| | | | |
|---|---|---|---|
| 4,228,232 | 10/1980 | Rousseau | 430/284 |
| 4,458,007 | 7/1984 | Geissler | 430/281 |
| 4,481,281 | 11/1984 | Tsao | 522/93 |

Primary Examiner—Wilbert J. Briggs, Sr.
Assistant Examiner—A. H. Koeckert
Attorney, Agent, or Firm—S. H. Parker; R. E. Bright

[57] ABSTRACT

An aqueous alkaline developable UV curable urethane acrylate compound and composition are used for making flexible solder mask coatings, characterized by rapid development in an aqueous, alkaline medium, and advantageous performance properties.

14 Claims, No Drawings

AQUEOUS ALKALINE DEVELOPABLE, UV CURABLE URETHANE ACRYLATE COMPOUNDS AND COMPOSITIONS USEFUL FOR FORMING SOLDER MASK COATINGS

BACKGROUND OF THE INVENTION

This invention relates to solder mask coatings having improved performance characteristics, and, more particularly, it is concerned with aqueous alkaline developable, UV curable urethane acrylate compounds and compositions useful for making such coatings.

Description of the Prior Art

In Rendulic, U.S. Pat. No. 4,436,806, there is described a method and apparatus for making a printed circuit board by imaging a liquid polymer which has been coated onto the board by roller coating. In this process, imaging is carried out while the polymer is wet, the photo tool being positioned in a close relationship with the coated board. The liquid polymer compositions disclosed by Rendulic for use in this process are urethane acrylates having a polyether or polyester extending chain unit. These compositions have a very low viscosity which is desirable for forming coatings with a roller coater. However, these compositions have a relatively low degree of ethylenic unsaturation per weight unit so that they require a relatively high energy level for curing.

In contrast to the imaging technique of the above-mentioned patent, Sullivan, in U.S. Pat. No. 4,506,004, describes a contact method of imaging a liquid solder mask coating on a printed circuit board. In this method, the UV curable solder mask coating is screen printed to a given thickness, prehardened and imaged by exposure with suitable UV energy. The desired characteristics of good electrical performance and excellent printing resolution are given as the attributes of the Sullivan system. The requirements of a suitable photopolymerizable compound for use in this process include an ability to form a smooth, flexible coating which can impart chemical and heat resistance to the solder mask. Furthermore, the coating must exhibit excellent adhesion to the board, and an ability to be cured to a desired depth with a minimum of UV energy.

A number of U.S. patents disclose photopolymerizable prepolymers and compositions for use as solder masks in printed circuit boards, including U.S. Pat. Nos. 3,660,088; 3,753,720; 3,883,352; 3,887,450; 4,199,163; 4,361,640; 4,422,914; 4,458,007; 4,481,281; and 4,508,916. However, none of these compounds and compositions are entirely satisfactory for use as a commercial solder mask, particularly as a solder mask in the liquid contact imaging system of U.S. Pat. No. 4,506,004.

An advantageous feature of a solder mask coating is an ability to be developed with an aqueous, slightly alkaline solution, thereby avoiding the use of organic solvents in the developing step. The solder mask coatings also should exhibit flexibility, heat and chemical resistance, surface hardness, abrasion resistance, adhesion to the underlying metal of the printed circuit board, and a high cure depth at low dosages. These stringent requirements imply that the structure of the prepolymer and its formulation must be carefully designed before the solder mask can achieve commercial acceptability.

Accordingly, it is an object of this invention to provide a UV curable urethane acrylate compound and composition for use as a solder mask, and, particularly, a composition which can be developed rapidly in an aqueous, slightly alkaline solution, preferably at a rate of at least 1 mil/min., at a temperature of less than 39° C. and at a pH of 8-11.

Another object of this invention is to provide a UV curable urethane acrylate compound and composition which can be coated, suitably by screen printing techniques, to form a smooth, uniform, glossy, flexible, coating up to 3 mil thickness.

Still another object herein is to provide such a coating which can be cured, preferably at an energy level of less than 4.5 joules per sq. cm., to provide a cure depth of at least 18 mils at this energy level.

Yet another object of the invention is to provide a solder mask composition which is stable without gelation for at least six months.

A further object herein is to provide a flexible solder mask coating having substantially 100% adhesion to the underlying metal of the printed circuit board, particularly on copper and tin-lead.

Another object herein is to provide a solder mask product which exhibits good surface hardness, abrasion, heat and organic solvent resistance.

A specific object herein is to provide a composition which is particularly adapted for use in the method and apparatus of making printed circuit boards described in U.S. Pat. No. 4,506,004.

These and other objects and features of the invention will be made apparent from the following description of the invention.

SUMMARY OF THE INVENTION

This invention provides a UV curable, aqueous alkaline developable urethane acrylate compound for formulation into a composition useful in making a solder mask coating. The urethane acrylate compound of the invention is obtained by reacting (i) at least one diisocyanate compound selected from the group consisting of aliphatic and cycloaliphatic diisocyanates, e.g. dicyclohexylmethylene diisocyanate, isophorone diisocyanate, and hexamethylene diisocyanate, (ii) one mole of a hydroxyalkyl acrylate; e.g. hydroxypropyl acrylate, (iii) a polyol having at least 3 hydroxyl groups, e.g. glycerol; and (iv) at least one mole of a dicarboxylic acid anhydride, saturated or unsaturated, e.g. maleic anhydride.

The urethane acrylate compound of the invention is characterized by the following: (a) terminal ethylenic unsaturation; (b) at least one terminal carboxylic acid group; and (c) alkylene connecting groups intermediate said terminal groups, one of which is preferably substituted with at least one hydroxy group.

Further, this invention provides a UV curable, aqueous alkaline developable urethane acrylate solder mask composition comprising:

(a) 40-70% by weight of the urethane acrylate compound, (b) 20-50% by weight of one or more reactive diluent monomers, and (c) 0.5-10% by weight of a photoinitiator.

The composition of the invention also may include about 1-5% by weight of one or more of the following: a cross-linking agent, a pigment or dye, a rheology modifier, and a thermal stabilizer; and 1-15% by weight of a filler.

A feature of the invention is the provision of a printed circuit board having a cured solder mask coating thereon which can be screen printed to form a smooth, uniform, glossy, flexible coating. This solder mask coating can be cured at a low energy level to provide a high cure depth and excellent surface hardness, and abrasion, heat and organic solvent resistance. The coating can be developed rapidly in an aqueous, slightly alkaline medium at room temperature.

Another feature of the invention is the provision of a UV curable urethane acrylate compound having a high degree of terminal ethylenic unsaturation per unit weight, which enables curing to take place at low energy levels. The compound has at least one terminal carboxylic group so that the cured coating can be developed rapidly in an aqueous, slightly alkaline medium. The compound is further characterized by the presence of an alkylene connecting group intermediate the terminal groups, which is preferably substituted with a hydroxyl group, which increases the aqueous solubility of the compound.

DETAILED DESCRIPTION OF THE INVENTION

The UV curable, aqueous alkaline developable urethane acrylate compound of this invention can be obtained by a three-step, two-part reaction sequence, the first step of which involves reacting a suitable diisocyanate compound with one mole of a hydroxyalkylacrylate to form the corresponding isocyanate-capped acrylate. Suitable diisocyanates for use in this step including aliphatic and cycloaliphatic diisocyanates, e.g. dicyclohexylmethylene diisocyanate, isophorone diisocyanate, hexamethylene diisocyanates, and trimethylhexamethylene diisocyanate. Aromatic diisocyanates are not preferred because they form non-flexible coatings.

The hydroxyalkyl acrylate reactant may be selected from such compounds as hydroxymethyl acrylate, hydroxyethyl acrylate, hydroxypropyl acrylate, hydroxybutyl acrylate and the like, although other acrylates known in the art may be used as well. For purposes of this invention the term "acrylate" includes the corresponding "methacrylate" derivatives.

The second step in the reaction sequence is esterification of a suitable polyol reactant with a dicarboxylic acid anhydride to form an ester of the dicarboxylic acid. Suitable polyols have at least three, and up to six, hydroxyl groups in the molecule, and include such compounds as glycerol, trimethylolpropane, 1,2,6-hexanetriol, caprolactone polyol, and sugars, such as fructose. Glycerol is preferred.

To improve heat resistance of the solder mask, part of the polyol, e.g. about 20% mole thereof, may include a suitable sulfur-containing diol, e.g. dihydroxydiphenylsulfone or the corresponding sulfide.

Suitable dicarboxylic acid anhydrides for this step include such acid anhydrides as maleic anhydride, succinic anhydride, glutaric anhydride, adipic anhydride, phthalic anhydride and the like. Maleic anhydride is preferred.

In carrying out this reaction, for example, with a triol, one mole of the acid anhydride is used, thus forming the monoester intermediate, and leaving two hydroxyl groups available for subsequent reaction. One hydroxyl group then will be substituted on the alkylene group in the final product. The corresponding diesters also may be prepared by using two moles of the acid anhydride, in which case two terminal carboxylic acid groups will be present in the final compound.

The third and final step in the process is the condensation of the isocyanate-capped acrylate with the ester of the dicarboxylic acid anhydride. The final reaction is characterized by terminal ethylenic unsaturation at one end, and at least one terminal carboxylic acid group at the other end, with the organic diisocyanate moiety attached to the unsaturated group, and a alkylene group adjacent said terminal acid group. Preferably, a hydroxyl group is present as a substituent on the alkylene group. Two terminal carboxylic acid groups also may be included in the final compound.

The desired urethane acrylate may be prepared by a three-step, one-pot synthesis wherein the four reactants are added sequentially in the same reaction vessel. In this method, the diisocyanate is charged and the hydroxyalkyl acrylate is added slowly. After an initial reaction between these reactants, the polyol is added, followed by the dicarboxylic acid anhydride.

One reaction sequence is given below.

METHOD OF PREPARING URETHANE ACRYLATE COMPOUND OF INVENTION

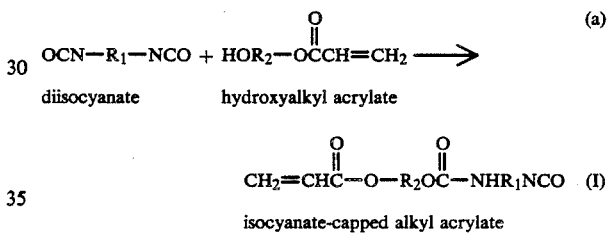

(a)

where
$R_1$ is aliphatic or cycloaliphatic, and
$R_2$ is alkylene;

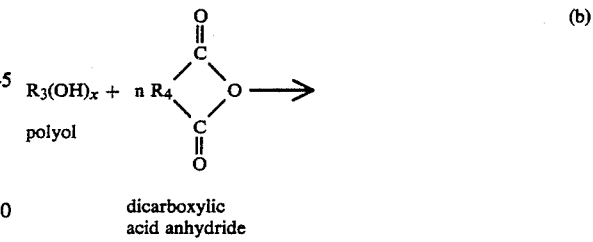

(b)

where
x is 3–6,
n is 1–5,
(x–n) is a positive integer,
$R_3$ is alkylene, and
$R_4$ is aliphatic or cycloaliphatic, saturated or unsaturated, or aromatic;

(c)

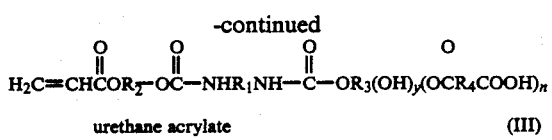

where
y is 0–4, provided, however, that if
y is 0, then n is at least 2.

As an illustration of the invention, the reaction of dicyclohexylmethylene diisocyanate, one mole of hydroxypropyl acrylate, glycerol and one mole of maleic anhydride is as follows:

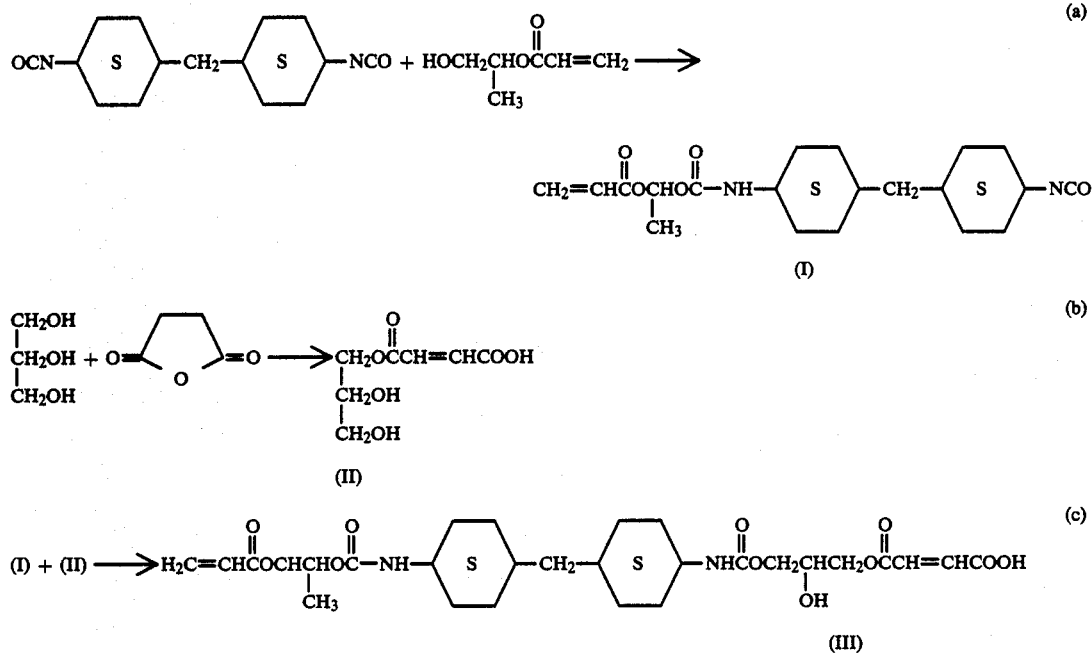

With 2 moles of maleic anhydride the reaction sequence is as follows:

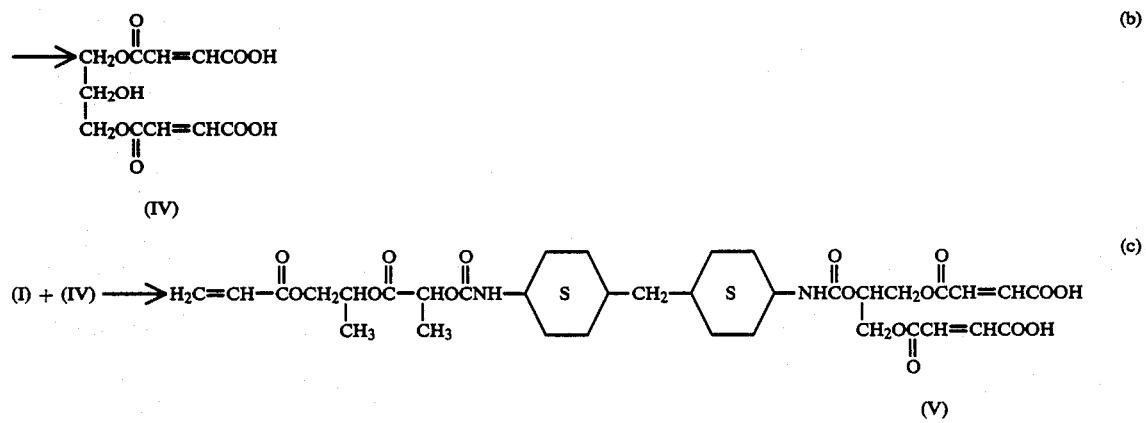

This invention also provides a UV curable, aqueous alkaline developable urethane acrylate composition for forming a soldering mask comprising:
(a) 40–70% by weight of a urethane acrylate compound which is obtained by reacting substantially equal molar quantities of an aliphatic or cycloaliphatic diisocyanate and a hydroxyalkyl acrylate, with a polyol having at least three hydroxyl groups, and at least one mole of a dicarboxylic acid anhydride per mole of said polyol;
(b) 20–50% of a reactive monomer diluent, and
(c) 0.5–10% of a photoinitiator.

The reactive diluent monomers are added to the urethane acrylates of the invention to reduce its viscosity in the composition, and increase the curing rate. Suitable reactive diluent monomers for use herein include ethylenically unsaturated monomers that are compatible and copolymerizable with the substituted urethane acrylates of the invention. Such ethylenically unsaturated monomers include mono-, di- and tri-acrylates as, for example, hydroxyalkyl acrylates, such as e.g. hydroxyethyl acrylate; and acrylate esters, e.g. methyl methacrylate, ethyl acrylate, 2-ethylhexyl acrylate, cyclohexyl acrylate, isobutoxymethyl methacrylate, t-butyl acrylate, methyl acrylate, butyl acrylate, 2-(N-ethylcarbamyl)ethyl methacrylate; aryloxyalkyl acrylates, e.g. phenoxyethyl acrylate; bis-phenol-A diacrylate, ethylene glycol diacrylate, polyethylene glycol diacrylate, glycerol diacrylate and methacrylate, bis-phenol A diacrylate, tetrapropylene glycol diacrylate, and the like. Suitable triacrylates include glycerol triacrylate, ethoxylated trimethylol triacrylate, and the like.

Other reactive compounds can be included in the composition of the invention to increase the cross-linking density of the coating. Such reactive compounds include, but are not limited to, pentaerythritol 3-mercaptopropionate, 1,4-butylene dimethacrylate or acrylate, 1,1,6,-6-tetrahydroperfluorohexanediol diacrylate, ethylene dimethacrylate, glycerol diacrylate or methacrylate, glycerol trimethacrylate, diallyl phthalate and 1,3,5-tri(2-methacryloxyethyl)-s-triazine.

The UV curable composition of this invention also contains a photoinitiator which generates free radicals owing to actinic light. Suitable examples of such photoinitiators include substituted and unsubstituted polynuclear quinones, such as 2-ethylanthraquinone, 2-t-butylanthraquinone, octamethylanthraquinone, 1,2-benzanthraquinone, 2,3-diphenylanthraquinone, thioxanthone, e.g. chloro and isopropyl derivates, and the like; ketoaldonyl compounds such, as diacetyl, benzyl and the like; α-ketoaldonyl alcohols and ethers, such as benzoin, pivalone, and the like; α-hydrocarbon-substituted aromatic acyloins such as α-phenylbenzoin, α,α-diethoxyacetophenone, and the like; and aromatic ketones such as benzophenone, 4,4'-bisdialkylaminobenzophenone, and the like. These photoinitiators may be used alone or as a combination of two or more of them. Examples of combinations include 2,4,5-triarylimidazole dimer and 2-mercaptobenzoquinazole, leucocrystal violet, tris(4-diethylamino-2-methylphenyl)methane, or the like, and compounds which may not have photoinitiating properties alone but which nevertheless can constitute a good photoinitiating system, in combination with the above-mentioned materials. Such compounds include, for example, tertiary amines, such as triethanolamine and the like, which are used in combination with benzophenone. These photoinitiators and/or photoinitiator systems preferably are present in an amount of about 0.5 to 10% by weight of the composition.

EXAMPLE 1

3-Step, One-Pot Synthesis of Urethane Acrylate (1)
Desmondur W/HPA/Glycerol/Maleic Anhydride (1)

$$H_2C=CH-\overset{O}{\overset{\|}{C}}-O-CH_2-\underset{CH_3}{\overset{|}{CH}}-O-\overset{O}{\overset{\|}{C}}-NH-\langle S \rangle-CH_2-\langle S \rangle-NHCOCH_2\underset{OH}{\overset{|}{CH}}CH_2O\overset{O}{\overset{\|}{C}}\overset{OCHCOOH}{\overset{\|}{CH}} \quad (1)$$

|   |                                                   | Parts | Equivalents |
|---|---------------------------------------------------|-------|-------------|
| A. | 4,4'-dicyclohexylmethylene diisocyanate (Desmondur W) | 262   | 2           |
| B. | Dibutyltin dilaurate                              | 1.7   | 2000 ppm    |
| C. | Hydroxylpropyl acrylate (HPA)                     | 130   | 1           |
| D. | Phenoxyethyl acrylate                             | 250   | 1.3         |
| E. | Glycerol                                          | 92.1  | 1           |
| F. | Maleic anhydride                                  | 98    | 1           |
| G. | Hydroquinone methyl ether                         | 1.7   | 2000 ppm    |

A resin kettle equipped with a mechanical stirrer, thermometer, drying tube and pressure equalizing dropping funnel was charged with (A), (B) and (D). The mixture then was stirred while (C) was added slowly over 20 min. The temperature was maintained at below 55° C. Upon completion of the addition, the mixture was maintained at 55°-60° C. until the NCO number was 10.7±0.3, as determined by titration. (E) then was added slowly over 30 min. and the temperature was maintained at below 55° C. Heating was continued at 60° C. until IR showed the absence of NCO absorption at 2275 cm$^{-1}$. (F) then was added to the reaction mixture at 70°-75° C. over 20 min., followed by (G). Heating was continued at 75° C. until the maleic anhydride was completely reacted, as indicated by the absence of peaks at 1845 and 1975 cm$^{-1}$.

The product was a viscous liquid having a Brookfield viscosity of 64,000 cps at 25° C., and an acid group contents of 1.48 meq/gm.

EXAMPLE 2

3-Step, One-Pot Synthesis of Urethane Acrylate (2)
Desmodur W/HPA/Glycerol/(Maleic Anhydride)$_2$ (2)

$$H_2C=CH-\overset{O}{\overset{\|}{C}}-O-CH_2-\underset{CH_3}{\overset{|}{CH}}-O-\overset{O}{\overset{\|}{C}}-NH-\langle S \rangle-CH_2-\langle S \rangle-NHCOCH-CH_2O\overset{O}{\overset{\|}{C}}\overset{OCHCOOH}{\overset{\|\|}{CH}} \quad (2)$$
$$\underset{CH_2OC-CH=COOH}{\underset{\overset{\|}{O}}{}}$$

|   |                                         | Parts  | Equivalents |
|---|-----------------------------------------|--------|-------------|
| A. | 4,4'-dicyclohexylmethylene diisocyanate | 262    | 2           |
| B. | Dibutyltin dilaurate                    | 1.9    | 2000 ppm    |
| C. | Hydroxylpropyl acrylate                 | 130    | 1           |
| D. | Phenoxyethyl acrylate                   | 291.5  | 1.52        |
| E. | Glycerol                                | 92.1   | 1           |
| F. | Maleic anhydride                        | 196    | 2           |
| G. | Hydroquinone methyl ether               | 1.9    | 2000 ppm    |

A resin kettle equipped with a mechanical stirrer, thermometer, drying tube and pressure equalizing dropping funnel was charged with (A), (B) and (D). The mixture then was stirred while (C) was added slowly over 20 min. The temperature was maintained at below 55° C. Upon completion of the addition, the mixture was maintained at 55°-60° C. until the NCO number was 10.7±0.3, as determined by titration. (E) then was added slowly over 30 min. and the temperature was maintained at below 55° C. Heating was continued at 60° C. until IR showed the absence of NCO absorption at 2275 cm$^{-1}$. (F) then was added to the reaction mixture at 70°-75° C. over 20 min., followed by (G). Heating was continued at 75° C. until the maleic anhydride was completely reacted, as indicated by the absence of peaks at 1845 and 1975 cm$^{-1}$.

The product was a viscous liquid having a Brookfield viscosity of 320,000 cps at 25° C., and an acid group contents of 2.60 meq/gm.

EXAMPLE 3

3-Step, 2-Pot Synthesis of Urethane Acrylate of Ex. 1

|  | Parts | Equivalents |
| --- | --- | --- |
| A. 4,4'-dicyclohexylmethylene diisocyanate | 262 | 2 |
| B. Dibutyltin dilaurate | 1.7 | 2000 ppm |
| C. Hydroxylpropyl acrylate | 130 | 1 |
| D. Phenoxyethyl acrylate | 168 |  |
| E. Glycerol | 92.1 |  |
| F. Maleic anhydride | 98 |  |
| G. Phenoxyethyl acrylate | 82 |  |
| H. Hydroquinone methyl ether | 1.7 | 2000 ppm |

A resin kettle, equipped with a mechanical stirrer, thermometer, drying tube and pressure equalizing dropping funnel was charged with (A), (B) and (D). The mixture was stirred while (C) was added slowly over 20 min. The temperature was maintained at below 55° C. Upon completion of the addition, the mixture was maintained at 55°-60° C. until the NCO number was 10.7±0.3 as determined by titration. In another resin kettle equipped with a mechanical stirrer, a thermometer and drying tube was charged with (E), (F) and (G). The mixture was heated with stirring at 90° C. until the maleic anhydride was completely reacted, as indicated by the absence of peaks at 1845 and 1975 cm$^{-1}$. This product was then added to the intermediate prepared in the first kettle, described above, over 45 min. at a temperature below 55° C. The reaction temperature was maintained at 60° C. until an infrared spectrum showed the absence of NCO absorption peak at 2275 cm$^{-1}$. (H) then was added and the mixture stirred until (H) completely dissolved. The product was a viscous liquid having a viscosity of 72,000 cps at 25° C., and acid group contents of 1.23 meq/gm.

EXAMPLE 4

The following composition was prepared using the urethane acrylate of Example 1, and then used in forming a solder mask for a printed circuit board.

| COMPOSITION | |
| --- | --- |
| Component | Parts by Wt. |
| Urethane acrylate of Ex. 1 | 60.0 |
| Tone-100 (Union Carbide) reactive diluent monomer | 25.5 |
| Pentaerythritol 3-mercaptopropionate-cross-linker | 3.0 |
| CAB-O-SIL thixotropic agent | 4 |

| -continued | |
| --- | --- |
| COMPOSITION | |
| Component | Parts by Wt. |
| Cymel 301 (Am. Cyan.) - cross-linker | 5 |
| IRG 651 (Ciba-Geigy) photoinitiator | 2 |
| CNF 853 - green pigment | 1 |
| Colloid 640 (Colloid Chem.) leveling agent | 0.8 |
| MTBHQ - mono-tert.-butyl hydroquinone-stabilizer | 0.2 |

This composition is thixotropic with a Brookfield viscosity of 208,000 cps at 25° C. at 0.5 rpm. and 39,000 cps at 100 rpm., and is stable without gelations for more than 6 months.

SOLDER MASK

A copper-clad epoxy fiber glass printed circuit board was cleaned by scrubbing to remove corrosion and foreign material, coated by screen printing with the above composition to a thickness of about 3 mils. Then a similar 3 mil thick coating was applied on a photo tool in accordance with the method given in U.S. Pat. No. 4,506,004, Example 2. The two coatings then were given a flash curing with about 0.2-0.4 joules per cm$^2$ of energy using a mercury vapor lamp, to effect partial hardening. The two coatings were then mated to form a composite of 6 mils thickness, flipped over and given a main exposure with 0.5 joules per cm$^2$ for 30 seconds. The unexposed coating then was developed by removing it (negative working) in a 1% sodium carbonate solution (pH 11) at room temperature for 4 min., and finally cured with 2.5 joules per cm$^2$ of UV energy.

The cured solder mask exhibited the following performance characteristics: a smooth, uniform, glossy, and flexible coating having 100% adhesion under a cross-hatch tape test both before and after application of solder, resistance to organic solvents of greater than 15 minutes by immersion test; excellent legend ink adhesion characteristics; excellent heat resistance as measured by a 20-second dip in solder at a temperature of 260° C. without blistering; very good surface hardness and abrasion resistance; and excellent adhesion to the printed circuit board.

EXAMPLE 5

The procedure of Ex. 4 was repeated using the urethane acrylate of Ex. 2, which has dicarboxylic acid terminal groups, to provide another solder mask with advantageous properties.

EXAMPLE 6

The procedures of Exs. 1-5 were repeated using a polyol mixture of 20 mole % of dihydroxydiphenylsulfone and 80 mole % of glycerol as the polyol in the synthesis of the urethane acrylates. The solder masks using this polyol showed improved heat resistance as compared to those using glycerol alone.

While the invention has been described with particular reference to certain embodiments thereof, certain changes and modifications may be made which are within the skill of the art.

It is intended to be bound only by the appended claims, in which what is clamed is:

1. A UV curable, aqueous alkaline developable, urethane acrylate composition comprising:
   (a) 40-70% by weight of a urethane acrylate which has the following formula:

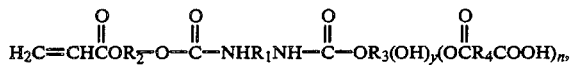

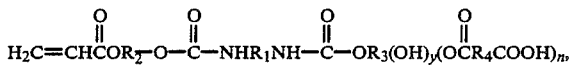

where
- $R_1$ is aliphatic or cycloaliphatic,
- $R_2$ and $R_3$ are alkylene.
- $R_4$ is aliphatic or cycloaliphatic, saturated or unsaturated, y is 0–4 and n is 1–5, provided that if y if 0, then n is at least 2;

(b) 20–50% by weight of a reactive monomer diluent, and (c) 0.5–10% by weight of a photoinitiator.

2. A composition according to claim 1 in which y is 1 and n is 1.

3. A composition according to claim 1 in which y is 0 and n is 2.

4. A composition according to claim 1 wherein said urethane acrylate compound is characterized by terminal ethylenic unsaturation, at least one terminal carboxylic acid group, and an alkylene group intermediate said terminal groups substituted with a hydroxyl group.

5. A composition according to claim 1 wherein said urethane acrylate compound has terminal ethylenic unsaturation, at least two terminal carboxylic acid groups, and an alkylene group intermediate said terminal groups optionally substituted with a hydroxyl group.

6. A UV curable, aqueous alkaline developable urethane acrylate compound having the formula:

where
- $R_1$ is aliphatic or cycloaliphatic,
- $R_2$ and $R_3$ are alkylene,
- $R_4$ is aliphatic or cycloaliphatic, saturated or unsaturated, or aromatic,
- y is 0–4, and
- n is 1–5; provided that if y is 0, then n is at least 2.

7. A UV curable, aqueous alkaline developable urethane acrylate compound according to claim 6 in which y is 1 and n is 1.

8. A UV curable, aqueous alkaline developable urethane acrylate compound according to claim 6 in which y is 0 and n is 2.

9. A UV curable, aqueous alkaline developable urethane acrylate compound according to claim 6 in which $R_3$ is derived from glycerol.

10. A UV curable, aqueous alkaline developable urethane acrylate compound according to claim 9 in which y is 1 and n is 1.

11. A UV curable, aqueous alkaline developable urethane acrylate compound according to claim 9 in which $R_4$ is derived from an unsaturated aliphatic acid.

12. A UV curable, aqueous alkaline developable urethane acrylate compound in which $R_3$ is derived from glycerol, y is 1 and n is 1, $R_4$ is derived from maleic anhydride, and $R_1$ is derived from isophorone diisocyanate or hexamethylene diisocyanate.

13. A UV curable, aqueous alkaline developable urethane acrylate compound having the formula:

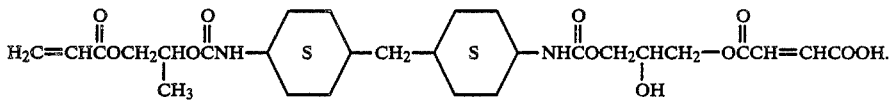

14. The soldering mask product of the cured composition of claim 1.

* * * * *